(12) United States Patent
Hahn et al.

(10) Patent No.: US 9,947,847 B2
(45) Date of Patent: Apr. 17, 2018

(54) OPTOELECTRONIC SEMICONDUCTOR CHIP AND OPTOELECTRONIC MODULE

(71) Applicant: OSRAM Opto Semiconductors GmbH, Regensburg (DE)

(72) Inventors: Berthold Hahn, Hemau (DE); Johannes Baur, Regensburg (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 14/773,864

(22) PCT Filed: Mar. 24, 2014

(86) PCT No.: PCT/EP2014/055835
§ 371 (c)(1),
(2) Date: Sep. 9, 2015

(87) PCT Pub. No.: WO2014/161738
PCT Pub. Date: Oct. 19, 2014

(65) Prior Publication Data
US 2016/0027980 A1    Jan. 28, 2016

(30) Foreign Application Priority Data

Apr. 5, 2013 (DE) .................. 10 2013 103 409

(51) Int. Cl.
*H01L 33/62* (2010.01)
*H01L 25/075* (2006.01)
(Continued)

(52) U.S. Cl.
CPC ............ *H01L 33/62* (2013.01); *H01L 25/042* (2013.01); *H01L 25/0753* (2013.01);
(Continued)

(58) Field of Classification Search
CPC . H01L 33/62; H01L 33/486; H01L 31/02002; H01L 31/0203
(Continued)

(56) References Cited

U.S. PATENT DOCUMENTS 8,319,250 B2  11/2012  Rode et al.
8,577,218 B2  11/2013  von Malm et al.
(Continued)

FOREIGN PATENT DOCUMENTS

CN          1941440 A      4/2007
CN       101587929 A     11/2009
(Continued)

*Primary Examiner* — Bo Fan
(74) *Attorney, Agent, or Firm* — Slater Matsil, LLP

(57) ABSTRACT

An optoelectronics semiconductor chip has a substrate and a semiconductor body arranged on the substrate and has a semiconductor layer sequence. The semiconductor layer sequence includes an active region arranged between a first semiconductor layer and a second semiconductor layer and is provided to generate or to receive radiation. The first semiconductor layer is electrically conductively connected to a first contact and to a second contact. The first contact is formed on a front side of the substrate, facing the semiconductor body. The second contact is formed on a rear side of the substrate, facing away from the semiconductor body. The first contact and the second contact are electrically conductively connected to each other.

18 Claims, 2 Drawing Sheets

(51) Int. Cl.
*H01L 31/05* (2014.01)
*H01L 25/04* (2014.01)
*H01L 31/02* (2006.01)
*H01L 31/0203* (2014.01)
*H01L 31/0224* (2006.01)
*H01L 33/48* (2010.01)
*H01L 33/38* (2010.01)

(52) U.S. Cl.
CPC .... *H01L 31/02002* (2013.01); *H01L 31/0203* (2013.01); *H01L 31/0224* (2013.01); *H01L 31/0516* (2013.01); *H01L 33/38* (2013.01); *H01L 33/486* (2013.01); *H01L 33/382* (2013.01); *H01L 2224/48091* (2013.01); *H01L 2224/48137* (2013.01); *H01L 2224/73265* (2013.01); *Y02E 10/50* (2013.01)

(58) Field of Classification Search
USPC ............................................ 257/88; 396/157
See application file for complete search history.

(56) References Cited

U.S. PATENT DOCUMENTS

| | | | |
|---|---|---|---|
| 8,823,024 B2 | 9/2014 | Engl et al. | |
| 8,878,227 B2 | 11/2014 | Moosburger et al. | |
| 8,890,306 B2 | 11/2014 | Reill et al. | |
| 8,956,897 B2 | 2/2015 | Rode et al. | |
| 2007/0241260 A1* | 10/2007 | Jaeger ............... H01L 31/02162 250/214.1 | |
| 2010/0171135 A1 | 7/2010 | Engl et al. | |
| 2011/0104836 A1 | 5/2011 | Rode et al. | |
| 2011/0234118 A1 | 9/2011 | Kim et al. | |
| 2011/0272728 A1* | 11/2011 | Rode ..................... H01L 25/167 257/99 | |
| 2012/0189291 A1* | 7/2012 | von Malm ............. G03B 15/05 396/157 | |
| 2012/0256538 A1 | 10/2012 | Takeuchi et al. | |
| 2014/0061703 A1 | 3/2014 | von Malm | |

FOREIGN PATENT DOCUMENTS

| | | |
|---|---|---|
| CN | 102017143 A | 4/2011 |
| CN | 102544258 A | 7/2012 |
| DE | 102008011848 A1 | 9/2009 |
| DE | 102008022942 A1 | 11/2009 |
| DE | 102008030584 A1 | 12/2009 |
| DE | 102008051050 A1 | 4/2010 |
| DE | 102009047788 A1 | 3/2011 |
| DE | 102010026344 A1 | 1/2012 |
| DE | 102010034665 A1 | 2/2012 |
| DE | 102011010503 A1 | 8/2012 |
| DE | 102011015821 A1 | 10/2012 |
| EP | 1770781 A2 | 4/2007 |
| JP | S62138468 U | 9/1987 |
| JP | 2001332768 A | 11/2001 |
| JP | 2008277561 A | 11/2008 |
| JP | 2010525585 A | 7/2010 |
| JP | 2011525708 A | 9/2011 |
| JP | 2011208139 A | 10/2011 |
| JP | 2011216524 A | 10/2011 |
| TW | 201212261 A | 3/2012 |
| WO | 2012022657 A1 | 2/2012 |
| WO | 2012060049 A1 | 5/2012 |

* cited by examiner

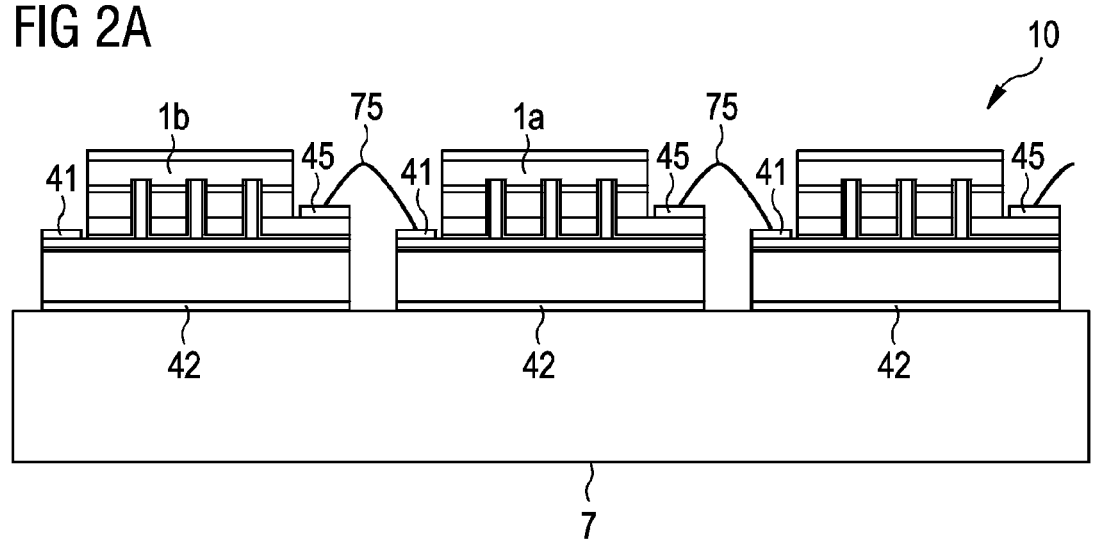
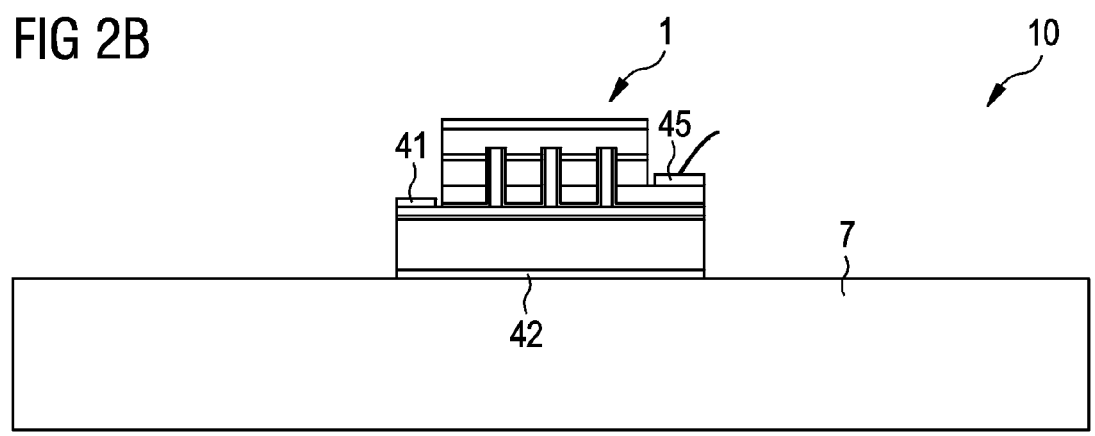
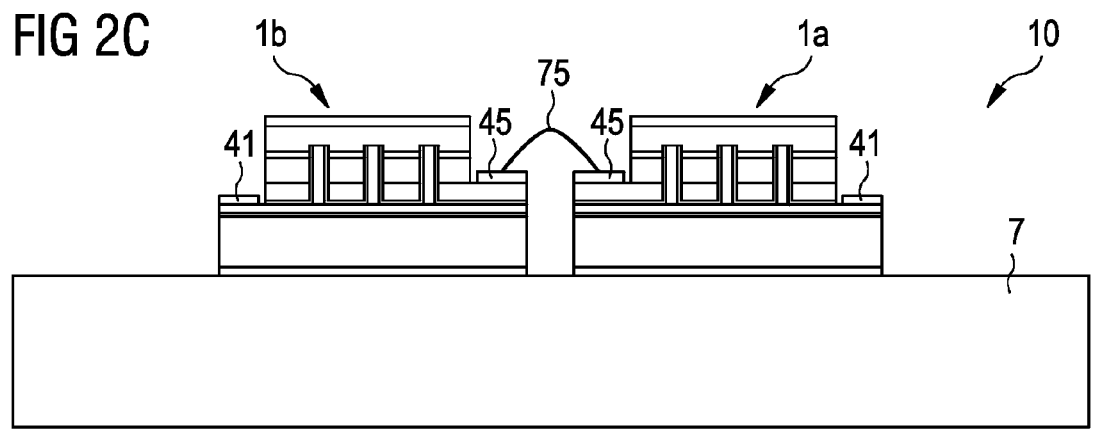

OPTOELECTRONIC SEMICONDUCTOR CHIP AND OPTOELECTRONIC MODULE

This patent application is a national phase filing under section 371 of PCT/EP2014/055835, filed Mar. 24, 2014, which claims the priority of German patent application 10 2013 103 409.8, filed Apr. 5, 2013, each of which is incorporated herein by reference in its entirety.

TECHNICAL FIELD

The present application relates to an optoelectronic semiconductor chip and to an optoelectronic module comprising at least one optoelectronic semiconductor chip.

BACKGROUND

For optoelectronic modules aimed at achieving the highest possible packing density of light emitting diodes, it is often desired for the light emitting diodes to be interconnected in series with one another directly via wire bonding connections. However, the arrangement of top-side bonding pads on the light emitting diodes makes it more difficult to provide a rectangular emission surface, which is expedient in particular for projection applications.

SUMMARY

Embodiments of the invention specify a semiconductor chip which is distinguished by particularly universal usability in conjunction with good optoelectronic properties. Further embodiments specify an optoelectronic module that is producible simply and reliably.

In accordance with at least one embodiment of the optoelectronic semiconductor chip, the optoelectronic semiconductor chip comprises a semiconductor body having a semiconductor layer sequence. The semiconductor layer sequence comprises, in particular, an active region, which is provided for generating and/or for receiving radiation. The active region is provided, for example, for receiving or for generating gradation in the ultraviolet, visible or infrared spectral range. The active region is arranged, for example, between a first semiconductor layer and a second semiconductor layer. Expediently, the first semiconductor layer and the second semiconductor layer differ from one another with regard to conduction type. By way of example, the first semiconductor layer is n-conducting and the second semiconductor layer is p-conducting, or vice versa. In a vertical direction, that is to say in a direction running perpendicularly to a main extension plane of the semiconductor layers of the semiconductor layer sequence, the semiconductor body extends in particular between a radiation passage surface and a main surface.

In accordance with at least one embodiment of the optoelectronic semiconductor chip, the optoelectronic semiconductor chip comprises a carrier. In a vertical direction, the carrier extends between a front side facing the semiconductor body and a rear side of the carrier facing away from the semiconductor body. The semiconductor body is arranged, and in particular fixed, on the carrier. By way of example, the semiconductor body is cohesively connected to the carrier.

In the case of a cohesive connection, the, preferably prefabricated, connection partners are held together by means of atomic and/or molecular forces. A cohesive connection can be obtained, for example, by means of a connection means, for instance an adhesive or a solder. In general, a separation of the connection is accompanied by destruction of the connection means and/or of at least one of the connection partners.

By way of example, the semiconductor body is fixed to the carrier by means of a connecting layer, in particular an electrically conductive connecting layer.

In accordance with at least one embodiment of the optoelectronic semiconductor chip, the optoelectronic semiconductor chip comprises a first contact, which is electrically conductively connected to the first semiconductor layer. The first contact is provided in particular for the external electrical connecting of the semiconductor chip, for example, by means of a connecting line, for instance a wire bonding connection. The first contact is formed, for example, on a front side of the carrier facing the semiconductor body. In other words, the first contact is accessible for external electrical contacting from the side of the semiconductor chip facing away from the carrier.

In accordance with at least one embodiment of the optoelectronic semiconductor chip, the optoelectronic semiconductor chip comprises a second contact, which is electrically conductively connected to the first semiconductor layer. The second contact is provided in particular for the external electrical contacting of the optoelectronic semiconductor chip. The second contact is formed, for example, on the rear side of the carrier. In a vertical direction, therefore, the carrier runs between the first contact and the second contact.

In accordance with at least one embodiment of the optoelectronic semiconductor chip, the first contact and the second contact are electrically conductively connected to one another. In other words, in the optoelectronic semiconductor chip there is a current path between the first contact and the second contact. In particular, the current path runs between the front side and the rear side of the carrier. During the operation of the optoelectronic semiconductor chip, the first contact and the second contact are at the same electrical potential. In particular, upon application of an electrical voltage between the first contact and the second contact, no electric current would flow through the semiconductor body, in particular through the active region. In other words, the electrically conductive connection between the first contact and the second contact runs completely outside the semiconductor body or at least completely outside the active region.

In accordance with at least one embodiment of the optoelectronic semiconductor chip, the first semiconductor layer is connected to the first contact and the second contact.

In at least one embodiment of the optoelectronic semiconductor chip, the optoelectronic semiconductor chip comprises a carrier and a semiconductor body having a semiconductor layer sequence, said semiconductor body being arranged on the carrier. The semiconductor body comprises an active region, which is arranged between the first semiconductor layer and a second semiconductor layer and is provided for generating and/or for receiving radiation. The first semiconductor layer is electrically conductively connected to a first contact and to a second contact. The first contact is formed on a front side of the carrier facing the semiconductor body. The second contact is formed on a rear side of the carrier facing away from the semiconductor body. The first contact and the second contact are electrically conductively connected to one another.

In accordance with at least one embodiment of the optoelectronic semiconductor chip, the carrier is electrically conductive. The carrier contains, for example, a semiconductor material, for instance silicon or germanium. In order to increase the electrical conductivity, the semiconductor material can be doped. Alternatively, the carrier can also contain a metal or a metallic alloy and can furthermore be embodied in a metallic fashion. In this case, the rear side of the carrier itself can form the second contact.

In a departure therefrom, it is also conceivable for the carrier to contain an electrically insulating material. By way of example, the carrier can have an electrically insulating main body, through which electrical plated-through holes, for example, recesses filled at least partly with a metal, extend in a vertical direction from the front side to the rear side. By way of example, a ceramic, for instance aluminum nitride or boron nitride, is suitable for an electrically insulating carrier.

In accordance with at least one embodiment of the optoelectronic semiconductor chip, the first semiconductor layer is arranged on the side of the active region facing away from the carrier. The active region is therefore arranged between the first semiconductor layer and the carrier. The first semiconductor layer is electrically conductively connected to the first contact in particular via a first connection layer. The first contact can be an area of the first connection layer that is accessible for the axial contacting, or a contact layer formed on the first connection layer.

In accordance with at least one embodiment of the optoelectronic semiconductor chip, the semiconductor body has at least one recess which extends through the second semiconductor layer and the active region. In particular, the first connection layer is connected to the first semiconductor layer in the recess. The first semiconductor layer is electrically contactable from the main surface of the semiconductor body via the recess. A contact area arranged on the radiation passage surface of the first semiconductor layer is therefore not required for the electrical contacting of the first semiconductor layer.

In accordance with at least one embodiment of the optoelectronic semiconductor chip, the semiconductor chip comprises a counter-contact, which is electrically conductively connected to the second semiconductor layer. The counter-contact is provided for external electrical contacting of the optoelectronic semiconductor chip. By applying an electrical voltage between the counter-contact and the first contact or between the counter-contact and the second contact, it is possible for charge carriers to be injected into the active region and to recombine therewith emission of radiation. In the case of an optoelectronic semiconductor chip embodied as a radiation receiver, charge carriers generated in the active region can be tapped off via the counter-contact and the first contact or via the counter-contact and the second contact.

The second semiconductor layer is electrically conductively connected to the counter-contact in particular via a second connection layer. The counter-contact can be an area of the second connection layer that is accessible for the external contacting or a contact layer formed on the second connection layer. The counter-contact is accessible for external contacting in particular from the front side of the carrier. By way of example, the second connection layer directly adjoins the main surface of the semiconductor body. Furthermore, the second connection layer can be embodied as a mirror layer for the radiation to be generated or to be received in the active region. By way of example, the mirror layer is embodied as a metallic mirror layer. For example, the second connection layer contains silver, aluminum, rhodium, palladium or gold or a metallic alloy comprising at least one of the materials mentioned.

In accordance with at least one embodiment of the optoelectronic semiconductor chip, the first contact and the counter-contact are arranged laterally with respect to the semiconductor body in a plan view of the semiconductor chip. In other words, the semiconductor body, the first contact and the counter-contact do not overlap one another at any point. In particular, the radiation passage surface of the semiconductor body is totally free of a contact area provided for the external contacting.

In accordance with at least one embodiment of the optoelectronic semiconductor chip, the first connection layer and the second connection layer run regionally between the semiconductor body and the carrier. In particular, the first connection layer can cover the carrier completely or substantially completely, that is to say with a degree of coverage of at least 90%, in a plan view of the semiconductor chip.

In accordance with at least one embodiment of the optoelectronic semiconductor chip, the second connection layer runs regionally between the first connection layer and the semiconductor body. In a plan view of the semiconductor chip, therefore, the first connection layer and the second connection layer overlap at least regionally.

In accordance with at least one embodiment of the optoelectronic semiconductor chip, the semiconductor body has a rectangular basic shape in a plan view of the semiconductor chip. The first contact and the second contact are arranged alongside one another on the same side as the semiconductor body in particular in a plan view of the semiconductor chip. In other words, the first contact and the counter-contact run along a side surface of the semiconductor body. In a plan view of the semiconductor chip, therefore, the semiconductor body is not situated at any point between the first contact and the counter-contact.

In accordance with at least one embodiment of the optoelectronic semiconductor chip, the optoelectronic semiconductor chip is embodied as a thin-film semiconductor chip. In the case of a thin-film semiconductor chip, a growth substrate for the in particular epitaxial deposition of the semiconductor layer sequence of the semiconductor body is removed completely or regionally. The carrier is therefore different from the growth substrate and serves for mechanically stabilizing the semiconductor layer sequence, such that the growth substrate is no longer required for this purpose.

In accordance with at least one embodiment of the optoelectronic semiconductor chip, a radiation conversion element is arranged on the semiconductor body. The radiation conversion element is provided in particular for converting primary radiation having a first peak wavelength that is generated in the semiconductor chip into secondary radiation having a second peak wavelength, which is different from the first peak wavelength. By way of example, the radiation conversion element is a prefabricated plate fixed to the semiconductor chip. Alternatively, the radiation conversion element can also be formed directly on the semiconductor chip, for example, in the form of a molding compound applied on the semiconductor chip. By virtue of the rectangular basic shape of the radiation passage surface, a radiation conversion element having a rectangular basic shape can furthermore be employed. Such a radiation conversion element is producible particularly simply.

In accordance with at least one embodiment, an optoelectronic module comprises an optoelectronic semiconductor chip arranged on a module carrier. The semiconductor chip has, in particular, at least one of the abovementioned features of the optoelectronic semiconductor chip.

In accordance with at least one embodiment of the module, the module comprises a first semiconductor chip and a second semiconductor chip, wherein the first semiconductor chip and the second semiconductor chip are electrically interconnected in series with one another. By way of example, a first contact of the first semiconductor chip and a counter-contact of the second semiconductor chip are electrically conductively connected to one another via a connecting line. In this case, the second contact of the semiconductor chips is not required for electrical contacting of the semiconductor chips.

In accordance with at least one embodiment of the module, the module carrier is embodied in an electrically insulating fashion. By way of example, a ceramic, for instance aluminum nitride or boron nitride, is suitable for the module carrier. Alternatively, the module carrier can also have an electrically conductive main body, which is provided with an electrically insulating coating on the side facing the semiconductor chips.

In accordance with at least one embodiment of the module, the module carrier is electrically conductive and a second contact of at least one semiconductor chip of the module is electrically conductively connected to the module carrier. By way of example, the module carrier can form a common rear contact for two or more semiconductor chips of the module, in particular for all semiconductor chips of the module. The counter-contacts of at least two semiconductor chips—or more extensively the counter-contacts of all the semiconductor chips—can likewise be electrically conductively connected to one another, such that the optoelectronic semiconductor chips are interconnected in parallel with one another. Alternatively, the counter-contacts of the individual semiconductor chips can also be electrically isolated from one another, such that the semiconductor chips are drivable independently of one another.

The above-described semiconductor chips are particularly suitable for the module. Features described in association with the semiconductor chips can therefore also be used for the module and vice versa.

In particular, the following technical effects can be achieved by means of the optoelectronic semiconductor chip described and respectively the optoelectronic module described.

The optoelectronic semiconductor chip is accessible for external electrical contacting from the front side of the carrier via the first contact and the counter-contact. The serial interconnection of such semiconductor chips is thereby simplified. In particular, the semiconductor chips can be mounted with a high packing density on a module carrier.

Furthermore, the first contact and the counter-contact can be arranged alongside one another and laterally with respect to the semiconductor body such that the radiation passage surface of the semiconductor chip has a rectangular basic shape. Such an optoelectronic semiconductor chip is therefore also particularly suitable for an optoelectronic module for projection applications.

The electrical contacting can be effected via two connecting lines, for instance two wire bonding connections. By contrast, rear-side contacting of the semiconductor chips is not required, and so an electrically insulating module carrier can also be employed.

Moreover, the optoelectronic semiconductor chip is alternatively also electrically contactable via the rear-side second contact and the front-side counter-contact. The contacting of the semiconductor chip can therefore also be effected via only exactly one front-side contact.

The semiconductor chip is therefore distinguished by a particularly high flexibility with regard to its electrical contactability and is therefore diversely usable.

BRIEF DESCRIPTION OF THE DRAWINGS

Further features, configurations and expediencies will become apparent from the following description of the exemplary embodiments in association with the figures.

In the figures:

FIGS. 2A to 2C each show an exemplary embodiment of an optoelectronic module in schematic sectional view.

Elements that are identical, of identical type or act identically are provided with identical reference signs in the figures.

The figures and the size relationships of the elements illustrated in the figures among one another should not be regarded as to scale. Rather, individual elements and in particular layer thicknesses may be illustrated with exaggerated size in order to enable better illustration and/or in order to afford a better understanding.

DETAILED DESCRIPTION OF ILLUSTRATIVE EMBODIMENTS

Figure 1A:
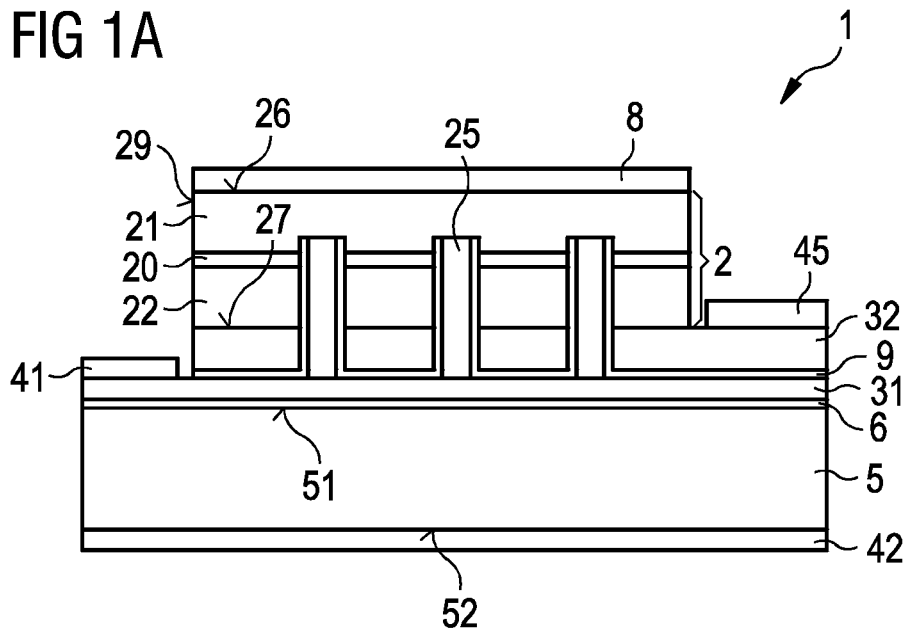
FIGS. 1A and 1B show one exemplary embodiment of an optoelectronic semiconductor chip in schematic sectional view (FIG. 1A) and schematic plan view (FIG. 1B)

One exemplary embodiment of an optoelectronic semiconductor chip 1 is shown in schematic sectional view in FIG. 1A.

The description is given below by way of example on the basis of a semiconductor chip provided for generating radiation, for example, a luminescence diode semiconductor chip, for instance an LED. In a departure therefrom, however, the semiconductor chip can also be embodied as a radiation receiver, in which provision is made of an active region for generating an electrical signal in a manner dependent on the radiation power impinging on the active region.

The semiconductor body 2 has a semiconductor layer sequence having an active region 20. The active region is provided for generating radiation in the ultraviolet, visible or infrared spectral range. In a vertical direction, that is to say perpendicular to a main extension plane of the semiconductor layer sequence of the semiconductor body, the semiconductor body 2 extends between a radiation passage surface 26 and a main surface 27. The active region 20 is arranged between a first semiconductor layer 21 of a first conduction type and a second semiconductor layer 22 of a second conduction type, which differs from the first conduction type. By way of example, the first semiconductor layer is n-conducting and the second semiconductor layer is p-conducting, or vice versa. The semiconductor body, in particular the active region, preferably contains a III-V compound semiconductor material.

III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. It holds true here in each case that $0 \leq x \leq 1$, $0 \leq y \leq 1$ and $x+y \leq 1$, in particular where $x \neq 1$, $y \neq 1$, $x \neq 0$ and/or $y \neq 0$. With III-V compound semiconductor materials, in particular from the material systems mentioned, high internal quantum efficiency can furthermore be obtained when generating radiation.

The semiconductor chip 1 furthermore comprises a carrier 5, which extends in a vertical direction between a front side 51 and a rear side 52. The carrier contains, for example, a doped semiconductor material, for instance silicon or germanium. The semiconductor body 2 is mechanically stably connected to the carrier 5 by means of a connecting layer 6, for example, an electrically conductive adhesive layer or a solder layer.

The semiconductor body 2 has a plurality of recesses 25 which extend from the main surface 27 through the second semiconductor layer 22 and the active region 20 into the first semiconductor layer 21 and end there. In the recesses 25, the first semiconductor layer is electrically conductively connected to a first connection layer 31. The first connection layer 31 covers the carrier 5 over the whole area. In a lateral direction, that is to say in a direction running along the main extension plane of the semiconductor layers of the semiconductor layer sequence, the first connection layer 31 projects regionally beyond the semiconductor body 2. A first contact 41 is formed on that part of the first connection layer 31 which is not covered by the semiconductor body 2. The first contact 41 is embodied as a bonding pad for the electrical contacting of the semiconductor chip by means of a wire bonding connection.

The first semiconductor layer 21 is furthermore electrically conductively connected to a second contact 42. The second contact is formed at the rear side 52 of the carrier 5. The first contact 41 and the second contact 42 are electrically conductively connected to one another via a current path extending from the front side 51 to the rear side 52. The current path runs by way of example through the electrically conductive carrier 5. In a departure therefrom, the carrier 5 can also have an electrically insulating main body, wherein electrical plated-through holes extend through the main body from the front side 51 to the rear side 52 and thus electrically conductively connect the first contact 41 and the second contact 42 to one another.

The first contact 41 need not necessarily be a layer provided in addition to the first connection layer 31. Alternatively, a region of the first connection layer 31 itself that is freely accessible for external electrical contacting can also form the first contact 41.

The optoelectronic semiconductor chip 1 furthermore comprises a counter-contact 45. The counter-contact 45 is electrically conductively connected to the second semiconductor layer 22 via a second connection layer 32. In a departure from the exemplary embodiment described, the counter-contact 45 can also be embodied as a region of the second connection layer 32 that is freely accessible for external electrical contacting.

The second connection layer 32 and the first connection layer 31 overlap at least regionally in a plan view of the semiconductor chip 1. An insulation layer 9 is formed between the first connection layer and the second connection layer. The insulation layer 9 also covers the side surfaces of the recesses 25 and thus insulates the first connection layer 31 from the second semiconductor layer 22 and from the active region 20.

The second connection layer 32 directly adjoins the main surface 22 of the semiconductor body 2. The second connection layer 32 is embodied as a minor layer for the radiation generated in the active region 20. Radiation that is generated in the active region and emitted in the direction of the carrier 5 can thus be reflected at the minor layer and subsequently emerge through the radiation passage surface 26. For a semiconductor chip which emits radiation in the ultraviolet or blue spectral range, silver, rhodium or palladium or an alloy comprising at least one of the materials mentioned is suitable, for example, for the mirror layer. For radiation in the infrared spectral range, gold, for example, is distinguished by a high reflectivity.

Figure 1B:
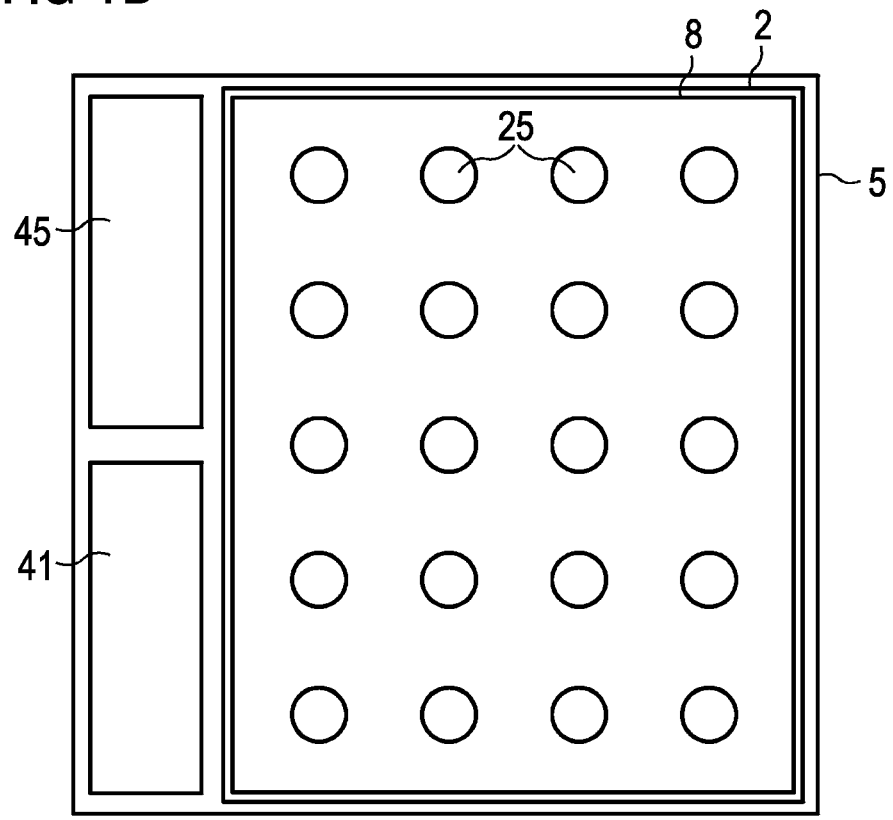

The first contact 41 and the counter-contact 45 are in each case arranged laterally with respect to the semiconductor body 2, such that a shading of the radiation passage surface 26 by a radiation-nontransmissive contact material can be avoided. In FIG. 1A, the first contact 41 and the counter-contact 45 are arranged on different sides of the semiconductor body 2 in order to enable improved illustration. Preferably, the first contact 41 and the counter-contact 45 run along a side surface 29 of the semiconductor body 2 in a plan view of the semiconductor chip, as shown in FIG. 1B. In this regard, a semiconductor chip in which the semiconductor body has a rectangular base shape and is electrically contactable via two front-side contacts is realized in a simple manner.

For operation of the optoelectronic semiconductor chip 1, an external electrical voltage can be applied either between the counter-contact 45 and the first contact 41 or between the counter-contact 45 and the second contact 42, such that charge carriers are injected from different sides into the active region 20 and recombine there with emission of radiation. The function of the semiconductor chip 1 is independent of whether the first contact 41 or the second contact 42 is externally electrically contacted. The contacting of the semiconductor chip can therefore be effected either via a front-side contact and a rear-side contact or via two front-side contacts.

Via the recesses 35, charge carriers can be injected into the first semiconductor layer 21 uniformly in a lateral direction. In particular depending on the transverse conductivity of the first semiconductor layer 21, the number of recesses can be varied within wide limits. In the extreme case, even an individual recess can be sufficient for the electrical contacting of the first semiconductor layer 21.

The optoelectronic semiconductor chip 1 is embodied as a thin-film semiconductor chip, in which a growth substrate for the semiconductor layer sequence of the semiconductor body 2 is removed after the epitaxial deposition of said semiconductor layer sequence. Such a semiconductor chip constitutes a Lambertian surface emitter to a good approximation. In a departure therefrom, however, the growth substrate can also remain completely in the semiconductor chip or be removed or thinned only regionally.

A radiation conversion element 8 is arranged on the radiation passage surface 26 of the semiconductor body 2. By way of example, radiation in the blue spectral range that is generated in the active region 20 of the semiconductor body can be at least partly converted into radiation in the yellow spectral range by means of the radiation conversion element, such that the semiconductor chip 1 emits mixed radiation that appears white overall to the human eye. By way of example, a prefabricated plate having a rectangular basic shape is suitable as radiation conversion element, said plate being fixed to the semiconductor body 2. Depending on the wavelength to be emitted, the radiation conversion element can also be dispensed with.

FIG. 2A shows an exemplary embodiment of an optoelectronic module 10, which comprises a plurality of semiconductor chips 1 embodied as described in association with FIGS. 1A and 1B. Depending on the total radiation power to be emitted of the optoelectronic module, the number of optoelectronic semiconductor chips 1 can be varied within wide limits.

The optoelectronic semiconductor chips 1 are arranged on an electrically insulating module carrier 7 and are fixed thereto. The electrical contacting of the semiconductor chips is effected via the front-side contacts, that is to say, in each case via the first contact 41 and the counter-contact 45. A first contact 41 of a first semiconductor chip 1a is connected to the counter-contact 45 of a second semiconductor chip 1b via a connecting line 75, for instance a wire bonding connection, such that said semiconductor chips are electrically interconnected in series with one another. By contrast, the rear-side second contact of the semiconductor chips is not used for the electrical contacting of the semiconductor chips.

In contrast thereto, the module carrier 7 in the exemplary embodiments illustrated in FIGS. 2B and 2C is embodied in each case in an electrically conductive fashion. The electrical contacting of the optoelectronic semiconductor chips 1 is effected via the second contact 42 and the counter-contact 45. By contrast, the first contact 41 is not externally electrically contacted. In the case of a plurality of optoelectronic semiconductor chips, it is possible, as illustrated in FIG. 2C, to obtain an electrically parallel interconnection of the semiconductor chips by means of an electrically conductive connection between the counter-contacts 45. It goes without saying that, in a departure therefrom, the counter-contacts 45 can also each be contacted individually, such that the individual semiconductor chips are drivable independently of one another.

The optoelectronic semiconductor chips described are therefore suitable both for an optoelectronic module in which the semiconductor chips are interconnected in series with one another and in an optoelectronic module or in an optoelectronic component in which rear-side contacting of the semiconductor chip is intended to be effected.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An optoelectronic semiconductor chip comprising:
    a carrier;
    a semiconductor body arranged on the carrier, the semiconductor body comprising;
        a semiconductor layer sequence having an active region arranged between a first semiconductor layer and a second semiconductor layer, the active region being provided for generating or for receiving radiation during operation; and
        a counter-contact electrically conductively connected to the second semiconductor layer, wherein the counter-contact is provided for external electrical contacting of the semiconductor chip;
    a first contact formed on a front side of the carrier facing the semiconductor body; and
    a second contact formed on a rear side of the carrier facing away from the semiconductor body, wherein the first semiconductor layer is electrically conductively connected to the first contact and to the second contact, wherein the first contact and the second contact are electrically conductively connected to one another,
    wherein the counter-contact is arranged on a side of the carrier facing the semiconductor body, the counter-contact and the semiconductor body being arranged side-by-side on the carrier,
    wherein the first contact is electrically connected to the first semiconductor layer via a first connection layer, the first connection layer directly adjoining the first semiconductor layer, the first semiconductor layer being arranged on a side of the active region that faces away from the carrier,
    wherein the second contact is electrically connected to the first semiconductor layer via the first connection layer and the carrier, and
    wherein the counter-contact is electrically connected to the second semiconductor layer via a second connection layer, the second connection layer directly adjoining the second semiconductor layer.

2. The semiconductor chip according to claim 1, wherein the carrier is electrically conductive.

3. The semiconductor chip according to claim 1, wherein the semiconductor body has a recess that extends through the second semiconductor layer and the active region, and wherein the first connection layer is connected to the first semiconductor layer in the recess.

4. The semiconductor chip according to claim 1, wherein the first contact and the counter-contact are arranged laterally with respect to the semiconductor body in a plan view of the semiconductor chip.

5. The semiconductor chip according to claim 1, wherein the first connection layer and the second connection layer run regionally between the semiconductor body and the carrier.

6. The semiconductor chip according to claim 1, wherein the second connection layer runs regionally between the first connection layer and the semiconductor body.

7. The semiconductor chip according to claim 1, wherein the semiconductor body has a rectangular basic shape in a plan view of the semiconductor chip.

8. The semiconductor chip according to claim 1, wherein the semiconductor body is cohesively connected to the carrier.

9. The semiconductor chip according to claim 1, wherein the first contact and the second contact are at the same electrical potential during the operation of the semiconductor chip.

10. An optoelectronic module comprising:
    a module carrier; and
    a first semiconductor chip arranged on the module carrier, the first semiconductor chip comprising:
        a carrier;
        a semiconductor body arranged on the carrier, the semiconductor body comprising:
            a semiconductor layer sequence having an active region arranged between a first semiconductor layer and a second semiconductor layer, the active region being provided for generating or for receiving radiation during operation; and
            a counter-contact electrically conductively connected to the second semiconductor layer, wherein the counter-contact is provided for external electrical contacting of the first semiconductor chip;
        a first contact formed on a front side of the carrier facing the semiconductor body; and
        a second contact formed on a rear side of the carrier facing away from the semiconductor body, wherein the first semiconductor layer is electrically conductively connected to the first contact and to the second contact, wherein the first contact and the second contact are electrically conductively connected to one another,
        wherein the counter-contact is arranged on a side of the carrier facing the semiconductor body, the counter-contact and the semiconductor body being arranged side-by-side on the carrier, wherein the first contact is electrically connected to the first semiconductor layer via a first connection layer, the first connection layer directly adjoining the first semiconductor layer, the first semiconductor layer being arranged on a side of the active region that faces away from the carrier, wherein the second contact is electrically connected to the first semiconductor layer via the first connection layer and the carrier, and wherein the counter-contact is electrically connected to the second semiconductor layer via a second connection layer, the second connection layer directly adjoining the second semiconductor layer.

11. The optoelectronic module according to claim 10, further comprising a second semiconductor chip, wherein the first semiconductor chip and the second semiconductor chip are electrically interconnected in a series with one another.

12. The optoelectronic module according to claim 11, wherein the first contact of the first semiconductor chip and a counter-contact of the second semiconductor chip are electrically connected to one another via a connecting line.

13. The optoelectronic module according to claim 10, wherein the module carrier comprises an electrically insulating material.

14. The optoelectronic module according to claim 10, wherein the module carrier is electrically conductive and the second contact of the first semiconductor chip is electrically conductively connected to the module carrier.

15. The semiconductor chip according to claim 1, wherein the first contact and the counter-contact run along a side surface of the semiconductor body in a plan view of the semiconductor chip.

16. The semiconductor chip according to claim 1, wherein the electrically conductive connection between the first contact and the second contact runs completely outside the active region.

17. The semiconductor chip according to claim 1, wherein the electrically conductive connection between the first contact and the second contact runs completely outside the semiconductor body.

18. The semiconductor chip according to claim 1, wherein there is no active region in a current path between the first contact and the second contact.

* * * * *